United States Patent [19]
Manning et al.

[11] Patent Number: 5,346,836
[45] Date of Patent: Sep. 13, 1994

[54] PROCESS FOR FORMING LOW RESISTANCE CONTACTS BETWEEN SILICIDE AREAS AND UPPER LEVEL POLYSILICON INTERCONNECTS

[75] Inventors: Monte Manning, Kuna; Steve V. Cole; Tyler A. Lowrey, both of Boise, all of Id.

[73] Assignee: Micron Technology, Inc., Boise, Id.

[21] Appl. No.: 108,147

[22] Filed: Aug. 17, 1993

Related U.S. Application Data

[63] Continuation of Ser. No. 713,589, Jun. 6, 1991, abandoned.

[51] Int. Cl.⁵ .................. H01L 21/283; H01L 21/223
[52] U.S. Cl. ........................ 437/46; 437/200; 437/201; 437/193; 437/52
[58] Field of Search ...................... 437/46, 52

[56] References Cited

U.S. PATENT DOCUMENTS

| | | | |
|---|---|---|---|
| 3,653,120 | 4/1972 | Sirrine et al. | 437/200 |
| 4,128,670 | 12/1978 | Gaensslen | 148/DIG. 147 |
| 4,978,637 | 12/1990 | Liou et al. | 437/200 |
| 5,003,375 | 3/1991 | Ichikawa | 437/200 |
| 5,013,686 | 5/1991 | Choi et al. | 437/200 |

FOREIGN PATENT DOCUMENTS 254524  2/1990  Japan .................. 437/200

*Primary Examiner*—Olik Chaudhuri
*Assistant Examiner*—David E. Graybill
*Attorney, Agent, or Firm*—David J. Paul

[57] ABSTRACT

A process for forming low resistance contacts between silicide areas and upper level polysilicon interconnect layers including a specific doping technique that provides solid low resistance contacts between a lower level of a silicided area and an upper level polysilicon interconnect. The doping technique combines a doping implant of the upper level polysilicon and an ion-mixing implant into a single implant thereby achieving a low resistive implant which also reduces processing steps.

12 Claims, 5 Drawing Sheets

PROCESS FOR FORMING LOW RESISTANCE CONTACTS BETWEEN SILICIDE AREAS AND UPPER LEVEL POLYSILICON INTERCONNECTS

This application is a continuation of application Ser. No 07/713,589 filed Jun. 6, 1991, now abandoned.

FIELD OF THE INVENTION

This invention relates to semiconductor devices and more particularly to a CMOS process to fabricate low resistive contacts between silicide areas and an upper level of polysilicon.

BACKGROUND OF THE INVENTION

During the fabrication of semiconductor devices using CMOS technology, conductive interconnects (or contacts) between different types of conductive material are required to form a circuit. For example, as an MOS transistor is formed in a silicon substrate's active area, its' gate, source and drain then have to be connected to other circuitry by a conductor, such as a conductively doped polysilicon line.

These interconnects are typically formed by depositing a layer of polysilicon over a desired buried contact location thus allowing the polysilicon to fill the contact hole and make physical connection to the underlying active area. Next the polysilicon is doped by a doping source to make an electrical connection. However, as critical dimensions became smaller, which shrinks the contact opening, a low resistive contact becomes very difficult if not impossible to obtain.

Several methods to form low resistive contact structures in MOS devices have been investigated that include: self-aligned silicides on the source/drain regions, elevated source/drain regions, buried-oxide MOS contacts and selectively deposited layers of metal in the contact holes. The most attractive approach turns out to be the self-aligned silicides on the source/drain regions as this self-aligned process does not entail any additional masking steps over a conventional contact formation process.

A typical process for forming self-aligned silicide contacts to an MOS transistor is shown in FIGS. 1a–1e. FIG. 1a shows previously doped active areas 2 (see FIG. 1a) implanted into silicon substrate 1 to form the transistor's source and drain. Oxide 3, separates substrate 1 from a polysilicon gate structure 4 to form the transistor's gate oxide.

In FIG. 1b, oxide 3 has been etched and silicon dioxide spacers 5 are deposited and etched. In FIGS. 1c and 1d, a metal has been deposited and annealed to form metal silicide 6, followed by selectively removing the unreacted metal.

Finally, in FIG. 1e, dielectric 7 is deposited and contact holes are opened down to silicide 6. Now metal 8 is deposited into the contact holes to make contact with silicide 6.

The typical approach to develop self-aligned silicide contacts provides good ohmic contacts between a source/drain active area and an upper lying conductor. Unfortunately, the upper lying conductor must be formed from a metal while polysilicon cannot be used as effectively without reintroducing the problems of a high resistive contact of conventional buried contacts.

The present invention introduces a process that further develops the use of silicide contacts and in particular self aligned silicide (or salicide) contacts, by developing a doping scheme that will allow the use of an upper layer of polysilicon as the interconnect layer between a silicided conductor while maintaining a low resistive contact.

SUMMARY OF THE INVENTION

The invention is directed to a process for forming low resistive contact between silicide areas and upper level polysilicon interconnect layers. A specific doping technique is developed that provides solid low resistive contacts between a lower level of a silicided area and an upper level polysilicon interconnect. The doping technique combines the doping implant of the upper level polysilicon and an ion-mixing implant into a single implant thereby achieving said low resistive implant which also reduces processing steps.

BRIEF DESCRIPTION OF THE DRAWINGS

FIG. 6b represents a dopant profile resulting from the implant step of FIG. 6a.

DETAILED DESCRIPTION OF THE PREFERRED EMBODIMENT

The present invention is directed to a process for forming low resistive contacts between lower level silicided areas and upper level polysilicon interconnect layers. A specific doping technique process is developed in a sequence shown in FIGS. 2–7.

Figure 1A:
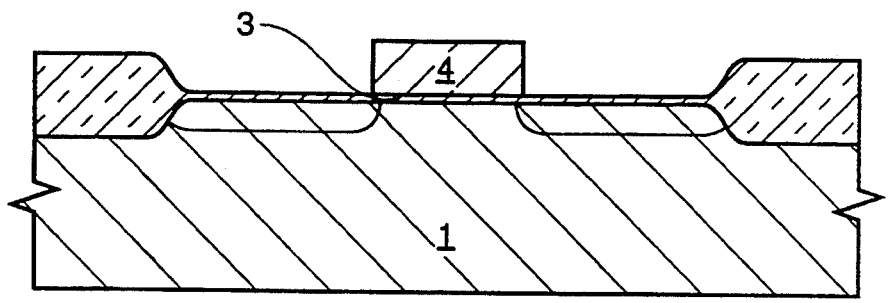
FIGS. 1a–1e, illustrate a typical process for forming self-aligned silicide contact structures on a MOS transistor.
Figure 1B:
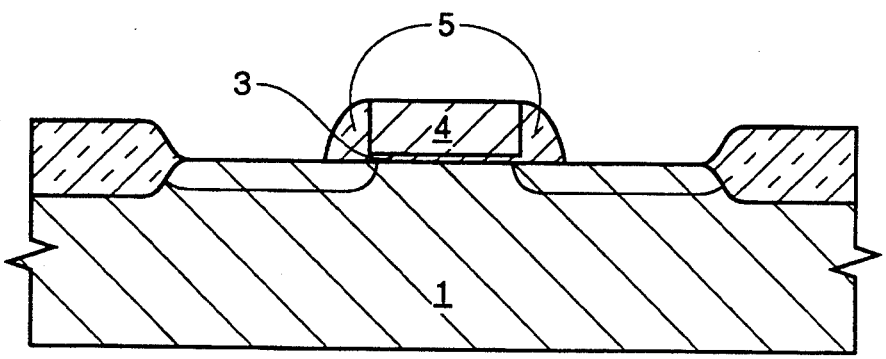
Figure 1C:
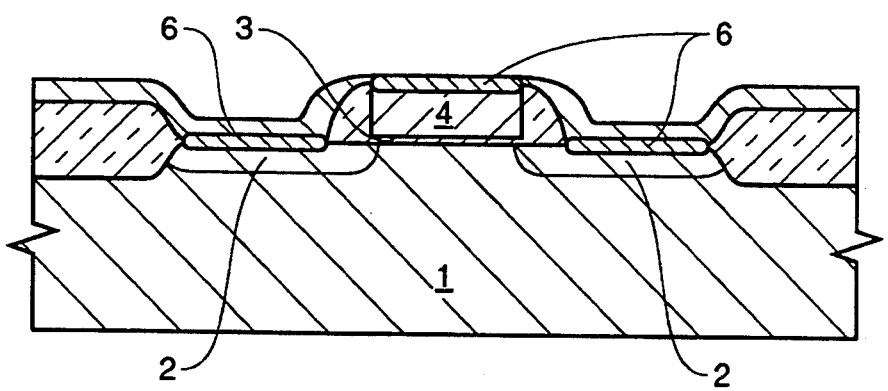
Figure 1D:
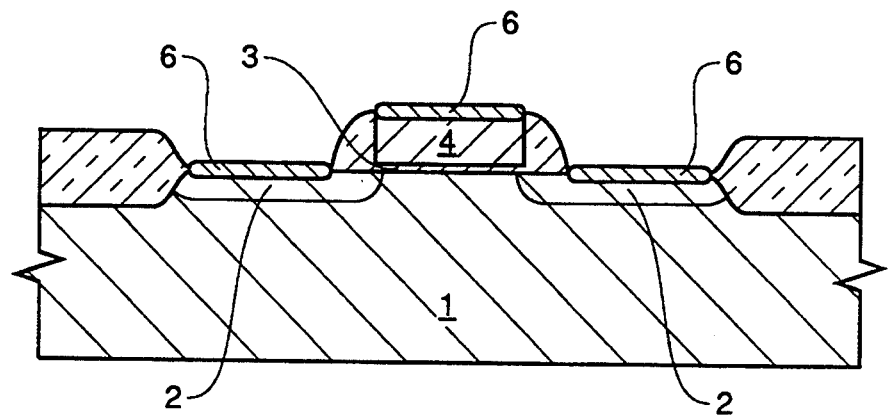
Figure 1E:
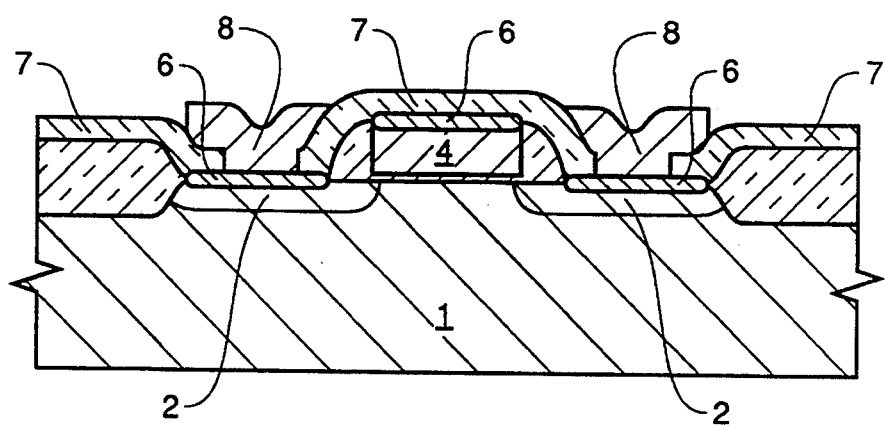
Figure 2:
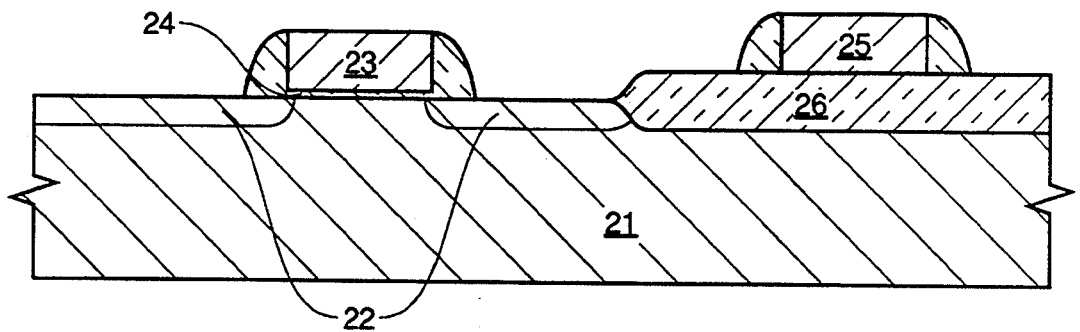
FIG. 2 shows a cross-sectional view of an in process wafer portion having source/drain regions implanted into a silicon substrate for a MOS transistor, a transistor gate and gate oxidation, and a conductor separated from the silicon substrate by field oxide.

As shown in FIG. 2, a silicon wafer is fabricated using conventional process steps, known to one skilled in the art, up to the point of having formed source/drain regions 22 in silicon substrate 21, conductive transistor gate 23 and gate oxidation 24, and conductor 25 separated from silicon substrate 21 by field oxidation 26.

Figure 3:
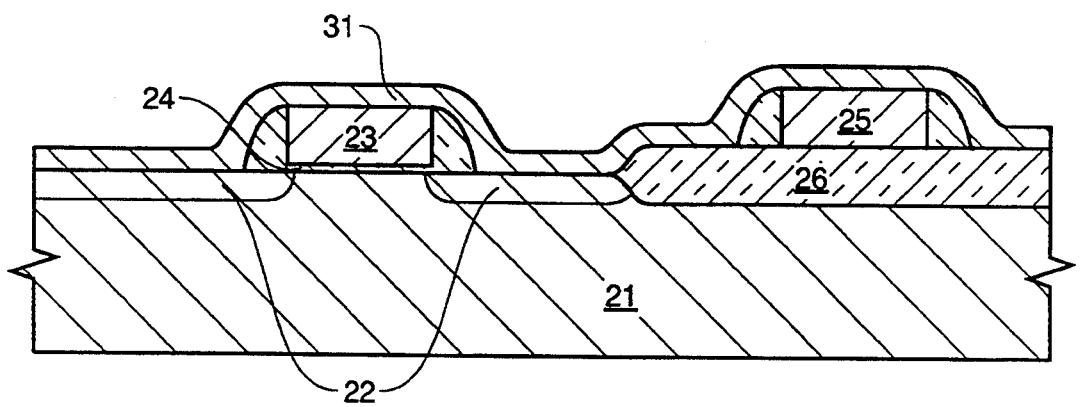
FIG. 3 shows a cross-sectional view of the in-process wafer portion of FIG. 2 after a conformal deposition of metal.

Referring now to FIG. 3, a layer of metal 31, such as, Titanium (Ti), Cobalt (Co), Platinum (Pt), Tungsten (W), Molybdenum, Palladium or Tantalum, is placed over the existing wafer surface. This metal is preferably deposited by chemical vapor deposition (CVD), however it could also be sputtered on or placed by any other conventional means available.

Figure 4:
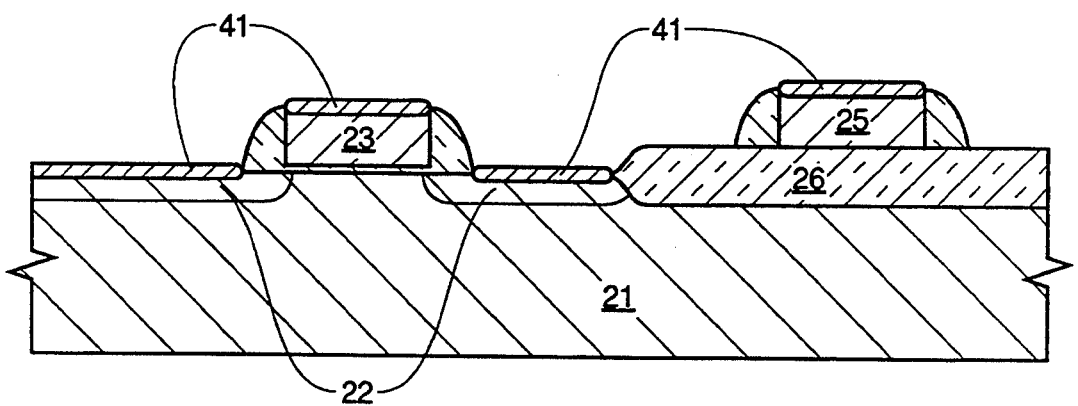
FIG. 4 shows a cross-sectional view of the in-process wafer portion of FIG. 3 after an annealing step to form metal silicide on conductive material followed by an etch to remove unreacted metal.

Referring now to FIG. 4, an annealing step has taken place to cause metal 31 (of FIG. 3) to react with active areas 22 and conductors 23 and 25. Conductors 23 and 25 have previously been formed from conductively doped polysilicon. This reaction forms silicide 41 on the surfaces of active areas 22 and conductors 23 and 25. Because the silicide is formed by annealing and is self aligned to the exposed surfaces of active areas 22 and conductors 23 and 25, the newly formed silicide surfaces will now be referred to as salicide surfaces 41. The unreacted metal is then etched away leaving the salicide surfaces 41 shown in the wafer profile illustrated in FIG. 4.

Figure 5:
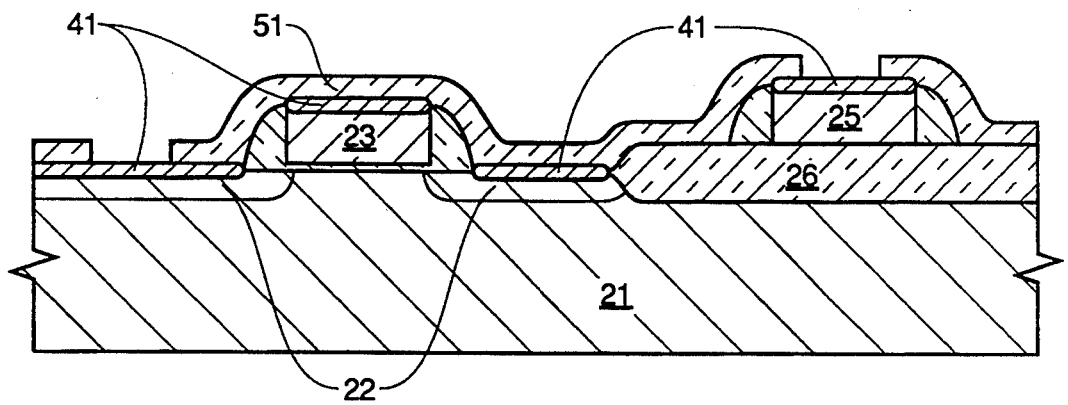
FIG. 5 shows a cross-sectional view of the in-process wafer portion of FIG. 4 after a conformal deposition of oxide followed by a contact etch to provide access to the desired interconnects yet to be made.

Referring now to FIG. 5, a conformal layer of dielectric 51, such as oxide or nitride is deposited, preferably by CVD. Dielectric 51 is then patterned and etched to provide interconnect (contact) openings to salicide surfaces 41. It is from this point on that the inventive features of the present invention come into play.

Figure 6A:
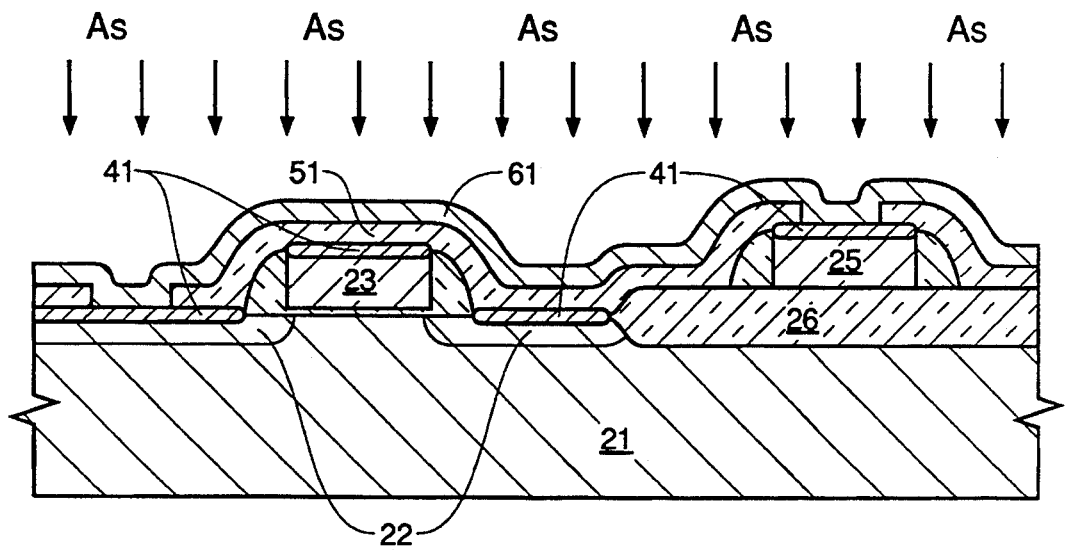
FIG. 6a shows a cross-sectional view of the in-process wafer portion of FIG. 4 after a conformal deposition of polysilicon followed by a doping impurities implant to form low resistive contacts between the desired silicided areas and the upper level polysilicon.

Referring now to FIG. 6a, a conformal layer of polysilicon 61 is deposited, thus making physical contact to salicide surfaces 41. Although not required, it is preferred to perform a dilute hydrofluoric acid (HF) dip to ensure the salicide surfaces 41 are clean prior to the deposition of polysilicon 61. Next, polysilicon is heavily doped by implanting an impurity such as Arsenic (As) or Phosphorus (Phos) at a sufficient energy to penetrate the interface between polysilicon 61 and salicide surfaces 41, yet not so high of an energy as to effect the final depths of source/drain regions 22.

Figure 6B:
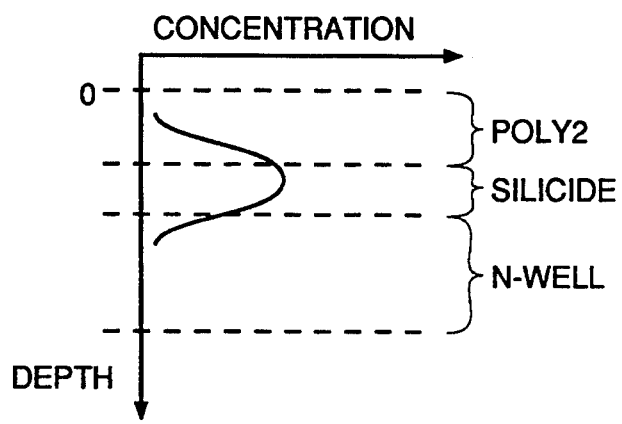

As an example of the implant step, the inset graph of FIG. 6b, illustrates an appropriate dopant concentration of As and the implant energy used with a given polysilicon thickness to accomplish a low resistive contact between polysilicon 61 and the underlying conductive materials via salicided surfaces 41. As shown in this figure, an As concentration of approximately $5 \times 10^{19}$ atoms /cm$^3$ is formed in a polysilicon layer being approximately 1000Å thick, by implanting As at an energy of approximately 180 keV with a dose of approximately $5 \times 10^{15}$ atoms/cm$^2$. As the profile in this figure shows, salicide 41 bonds strongly with polysilicon by virtue of ion-mixing that occurs during the implant and yet the depth of source/drain region 22 is affected very little. If the use of polysilicon 61 requires a uniformly doped polysilicon, an additional lower energy implant may be performed. This lower level implant will depend on the thickness of the polysilicon used and subsequent anneals in a given process. In addition, to attain the desired doping profile, the implants may be masked depending on the use of the upper level polysilicon (e.g., PMOS thin film transistors or intrinsic resistors where lower doped regions are also required in the upper level polysilicon, thereby necessitating the masking off of those low doped areas from the high dose As implant).

Figure 7:
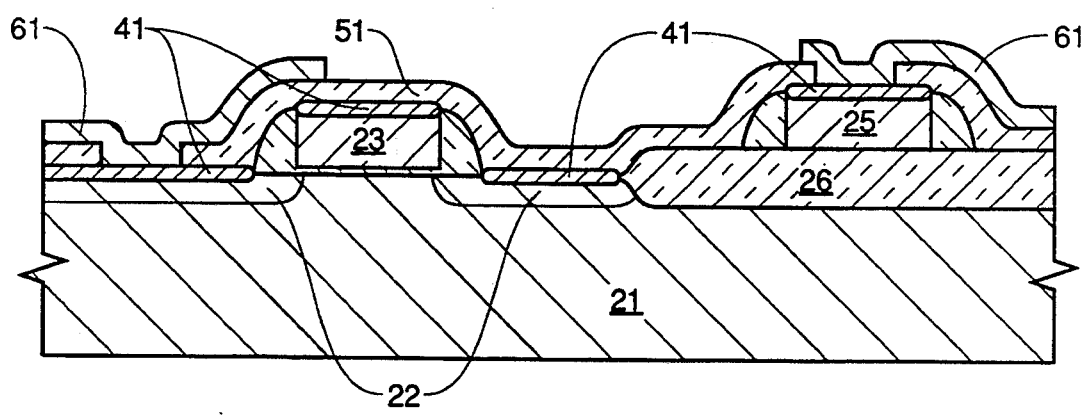
FIG. 7 shows a cross-sectional view of the in-process wafer portion of FIG. 6a after patterning and etching of the upper level of polysilicon.

Referring now to FIG. 7, polysilicon 61 is patterned and etched to form the appropriate conductive patterns while preserving low resistive buried contacts. In the preferred embodiment, due to the use of As as the dopant impurity, active areas 22 and polysilicon 25 were previously doped to an n-type conductivity. However, the inventive concept follows by using the appropriate dopant if p-type conductivity were desired.

These low resistive salicide contacts to upper level polysilicon can be implemented into any CMOS fabrication wherever a conductively doped lower level material can be subjected to saliciding techniques. The present invention has been used to create low resistive contacts in memory semiconductor devices such as static random access memory (SRAM) devices.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for forming low resistance interconnects between an active area having a silicided surface, and an upper level polysilicon layer, in a process used for fabrication of a semiconductor device on a silicon wafer substrate, said process comprising:
    a) forming said active area into said wafer substrate;
    b) forming said silicided surface from a layer of metal deposited on said active area;
    c) forming a dielectric over existing materials residing over said wafer surface;
    d) providing openings to said silicided surface at interconnect locations;
    e) depositing a layer of said upper level polysilicon on said dielectric and into said openings to thereby form said silicided surface; and
    f) implanting a dopant impurity of arsenic at a dose of approximately $5 \times 10^{15}$ atoms/cm$^2$ at an implanting energy of approximately 180 keV into said upper level polysilicon layer being approximately 1000Å thick, thereby conductively doping said layer of upper level polysilicon;
    wherein a major portion of implanted conductive impurities reside at the interface between said upper level polysilicon and said silicided surface, thereby forming low resistive contacts between said silicide surfaced active areas and said conductively doped upper level polysilicon.

2. A process as recited in claim 1, wherein said active area forms an n-type source/drain region of an NMOS transistor.

3. A process as recited in claim 1, wherein said active area forms a p-type source/drain region of a PMOS transistor.

4. A process as recited in claim 1, wherein said semiconductor device is a memory semiconductor device.

5. A process as recited in claim 4, wherein said memory semiconductor device is an SRAM.

6. A process as recited in claim 1, wherein said metal is selected from the group consisting of titanium, cobalt, platinum, tungsten, molybdenum, palladium and tantalum.

7. A process for forming low resistance interconnects between a lower level conductively doped polysilicon having a silicided surface, and an upper level polysilicon layer, in a process used for fabrication of a semiconductor device on a silicon wafer substrate, said process comprising:
    a) forming said silicided surface from a layer of metal deposited on said lower level conductively doped polysilicon;
    b) forming a dielectric over existing materials residing over said wafer surface;
    c) providing openings to said silicided surface at interconnect locations;
    d) depositing a layer of said upper level polysilicon on said dielectric and into said openings to thereby form said silicided surface; and e) implanting a dopant impurity of arsenic at a dose of approximately $5 \times 10^{15}$ atoms/cm$^2$ at an implanting energy of approximately 180 keV into said upper level polysilicon layer being approximately 1000Å thick, thereby conductively doping said layer of upper level polysilicon;

wherein a major portion of implanted conductive impurities reside at the interface between said Upper level polysilicon and said silicided surface, thereby forming resistive contacts between said silicide surfaced lower level conductively doped polysilicon and said conductively doped upper level polysilicon.

8. A process as recited in claim 7, wherein said conductively doped lower and upper polysilicon are n-type conductivity.

9. A process as recited in claim 7, wherein said conductively doped lower and upper polysilicon are p-type conductivity.

10. A process as recited in claim 7, wherein said semiconductor device is a memory semiconductor device.

11. A process as recited in claim 10, wherein said memory semiconductor device is an SRAM.

12. A process as recited in claim 7, wherein said metal is selected from the group consisting of titanium, cobalt, platinum, tungsten, molybdenum, palladium and tantalum.

* * * * *